(12) United States Patent
Moffatt et al.

(10) Patent No.: US 7,113,036 B2
(45) Date of Patent: Sep. 26, 2006

(54) METHOD AND APPARATUS FOR ADAPTIVE DIGITAL PREDISTORTION USING NONLINEAR AND FEEDBACK GAIN PARAMETERS

(75) Inventors: James P. Moffatt, Salem, NH (US); Jeffrey H. Saunders, Andover, MA (US)

(73) Assignee: Agere Systems Inc., Allentown, PA (US)

( * ) Notice: Subject to any disclaimer, the term of this patent is extended or adjusted under 35 U.S.C. 154(b) by 96 days.

(21) Appl. No.: 10/825,614

(22) Filed: Apr. 15, 2004

(65) Prior Publication Data

US 2005/0231279 A1    Oct. 20, 2005

(51) Int. Cl.
*H03F 1/26* (2006.01)

(52) U.S. Cl. ........................ 330/149; 375/297
(58) Field of Classification Search ............... 330/149, 330/129, 136, 279; 375/297; 455/63
See application file for complete search history.

(56) References Cited

U.S. PATENT DOCUMENTS

| | | | |
|---|---|---|---|
| 5,404,378 A | 4/1995 | Kimura | 375/296 |
| 5,650,758 A | 7/1997 | Xu et al. | 330/149 |
| 5,745,006 A | 4/1998 | Budnik et al. | 330/149 |
| 5,898,338 A | 4/1999 | Proctor et al. | 330/149 |
| 6,112,062 A | 8/2000 | Hans et al. | 455/114 |
| 6,275,685 B1 * | 8/2001 | Wessel et al. | 455/126 |
| 6,288,610 B1 | 9/2001 | Miyashita | 330/149 |
| 6,298,097 B1 | 10/2001 | Shalom | 375/297 |
| 6,356,146 B1 * | 3/2002 | Wright et al. | 330/2 |
| 6,359,508 B1 * | 3/2002 | Mucenieks | 330/149 |
| 6,489,846 B1 | 12/2002 | Hatsugai | 330/149 |
| 6,504,425 B1 * | 1/2003 | Kim | 330/2 |
| 6,545,535 B1 | 4/2003 | Andre | 330/149 |
| 6,590,451 B1 | 7/2003 | McRory | 330/149 |
| 6,646,506 B1 | 11/2003 | Hofmann et al. | 330/149 |
| 6,674,808 B1 | 1/2004 | Griph et al. | 375/285 |
| 6,680,649 B1 * | 1/2004 | Rydin | 330/149 |
| 6,711,217 B1 | 3/2004 | Jeong | 375/297 |

* cited by examiner

*Primary Examiner*—Henry Choe (57) ABSTRACT

A predistorter is disclosed that predistorts an input signal based on one or more static coefficients that are representative of a non-linear distortion characteristic of an amplifier. The input signal is also processed based on a non-linear gain parameter that reduces an error metric between the input signal and a feedback signal. The nonlinear gain parameter adapts an amount of nonlinearity introduced by the predistorter. The non-linear gain adaptation is performed, for example, when the input voltage is above a threshold input voltage. The input signal can be processed by multiplying the input signal by the non-linear gain parameter followed by table-coefficient processing, or by both multiplying the input by the non-linear gain parameter followed by dividing the table-coefficient processed output signal by the same non-linear gain parameter. The input signal can also be processed based on a feedback gain parameter that compensates for a small-signal gain of the feedback loop. The feedback gain parameter attempts to maintain a small-signal gain of approximately unity.

23 Claims, 12 Drawing Sheets

AM / AM CHARACTERISTIC CORRECTION TABLE 1010

| RECORD IDENTIFIER | QUANTIZED INPUT VOLTAGE LEVEL | MAGNITUDE CORRECTED VOLTAGE OUTPUT PER $-0.0518*u^3 + 0.1596*u^5 - 0.0320*u^7 + 0.0139*u^9$ |
|---|---|---|
| 1 | 0 | 0 |
| 2 | 0.0009766 | -4.82424E-11 |
| 3 | 0.0019531 | -3.85936E-10 |
| 4 | 0.0029297 | -1.30251E-09 |
| ... | ... | ... |
| 1023 | 0.9980469 | 0.088642915 |
| 1024 | 1.0000000 | 0.0897 |

FIG. 10A

AM / PM CHARACTERISTIC CORRECTION TABLE

1050

| RECORD IDENTIFIER | MAGNITUDE CORRECTED INPUT VOLTAGE LEVEL | PHASE CORRECTED VOLTAGE OUTPUT PER $0.3117*u^2 - 0.0437*u^4$ |
|---|---|---|
| 1 | 0 | 0 |
| 2 | -4.82424E-11 | 6.23723E-22 |
| 3 | -3.85936E-10 | 3.99176E-20 |
| 4 | -1.30251E-09 | 4.54673E-19 |
| ... | ... | ... |
| 1023 | 0.088642915 | 0.002105828 |
| 1024 | 0.0897 | 0.002156352 |

FIG. 10B

METHOD AND APPARATUS FOR ADAPTIVE DIGITAL PREDISTORTION USING NONLINEAR AND FEEDBACK GAIN PARAMETERS

FIELD OF THE INVENTION

The present invention relates generally to techniques for compensating for non-linearities in amplifiers, and, more particularly, to adaptive digital predistortion techniques.

BACKGROUND OF THE INVENTION

Communication devices must comply with various emission requirements and other spectrum constraints defined by a number of regulatory bodies, such as the Federal Communications Commission (FCC) in the United States, or communication standards, such as the IS-95 Base Station Emission Requirements, defined in TIA/EIA-95-B, "Mobile Station—Base Station Compatibility Standard for Wideband Spread Spectrum Cellular Systems," Section 7—Requirements for Base Station CDMA Operation. Adjacent Channel Power Ratio (ACPR), for example, is one such constraint that is generally defined as the ratio of the average power in the adjacent frequency channel to the average power in the transmitted frequency channel. In other words, while a wireless communication device may be configured to transmit over a specific frequency channel at any given time, it is difficult to prevent the energy transmitted by the device from spreading over into adjacent channels. If too much energy resides in the adjacent channels, then the energy can interfere with devices operating on the adjacent channels.

One source of ACPR is the inherent non-linearity found in various communication device components, including RF amplifiers. Currently, two methods are employed to compensate for non-linearities in RF amplifiers. Feedback methods continuously track the output signal of an amplifier and correct for non-linearities using a negative feedback loop. Predistortion methods predistort the magnitude and phase of the input signal so as to cancel distortion introduced by the amplifier, and thereby provide a linear output signal.

Generally, predistortion methods inject a predistortion signal into the input signal path of the RF amplifier. The predistortion signal is approximately equal and opposite to the expected distortion at the amplifier output, in order to cancel the distortion of the RF amplifier. The distortion of an amplifier varies with the temperature and age of the amplifier. Thus, a number of adaptive predistortion techniques have been proposed or suggested to address the varying temperature and aging effects. Adaptive predistortion methods attempt to continuously minimize the distortion in the amplifier output using an error signal.

While existing predistorters effectively compensate for non-linearities in RF amplifiers, they suffer from a number of limitations, which if overcome, could further improve the efficiency of RF amplifiers. In particular, in order to generate the power levels required for evolving communication systems, without excessive heat and within the relevant spectrum constraints, a need exists for improved predistortion systems that allow amplifiers to be more efficient and generate higher output power levels.

SUMMARY OF THE INVENTION

Generally, a method and apparatus are provided for pre-distorting an input signal. The input signal is predistorted based on one or more static coefficients that are representative of a non-linear distortion characteristic of an amplifier, such as an AM/AM characteristic or an AM/PM characteristic (or both). The input signal is also processed based on a non-linear gain parameter that reduces an error metric between the input signal and a feedback signal. The non-linear gain parameter adapts an amount of nonlinearity introduced by the predistorter. The non-linear gain adaptation is performed, for example, only when the input voltage is above a threshold input voltage that identifies, for example, a compression zone. The error metric may be, for example, a squared difference between the input signal and the feedback signal.

According to a further aspect of the invention, the input signal is processed based on a feedback gain parameter that compensates for a small-signal gain of the feedback loop. The feedback gain parameter attempts to maintain a small-signal gain of approximately unity. The small-signal gain is a difference between the input signal and the feedback signal. According to another aspect of the invention, the input signal can be processed by multiplying the input signal by the non-linear gain parameter followed by table-coefficient processing, or by both multiplying the input by the non-linear gain parameter followed by dividing the table-coefficient processed output signal by the same non-linear gain parameter.

A more complete understanding of the present invention, as well as further features and advantages of the present invention, will be obtained by reference to the following detailed description and drawings.

DETAILED DESCRIPTION

Figure 1:
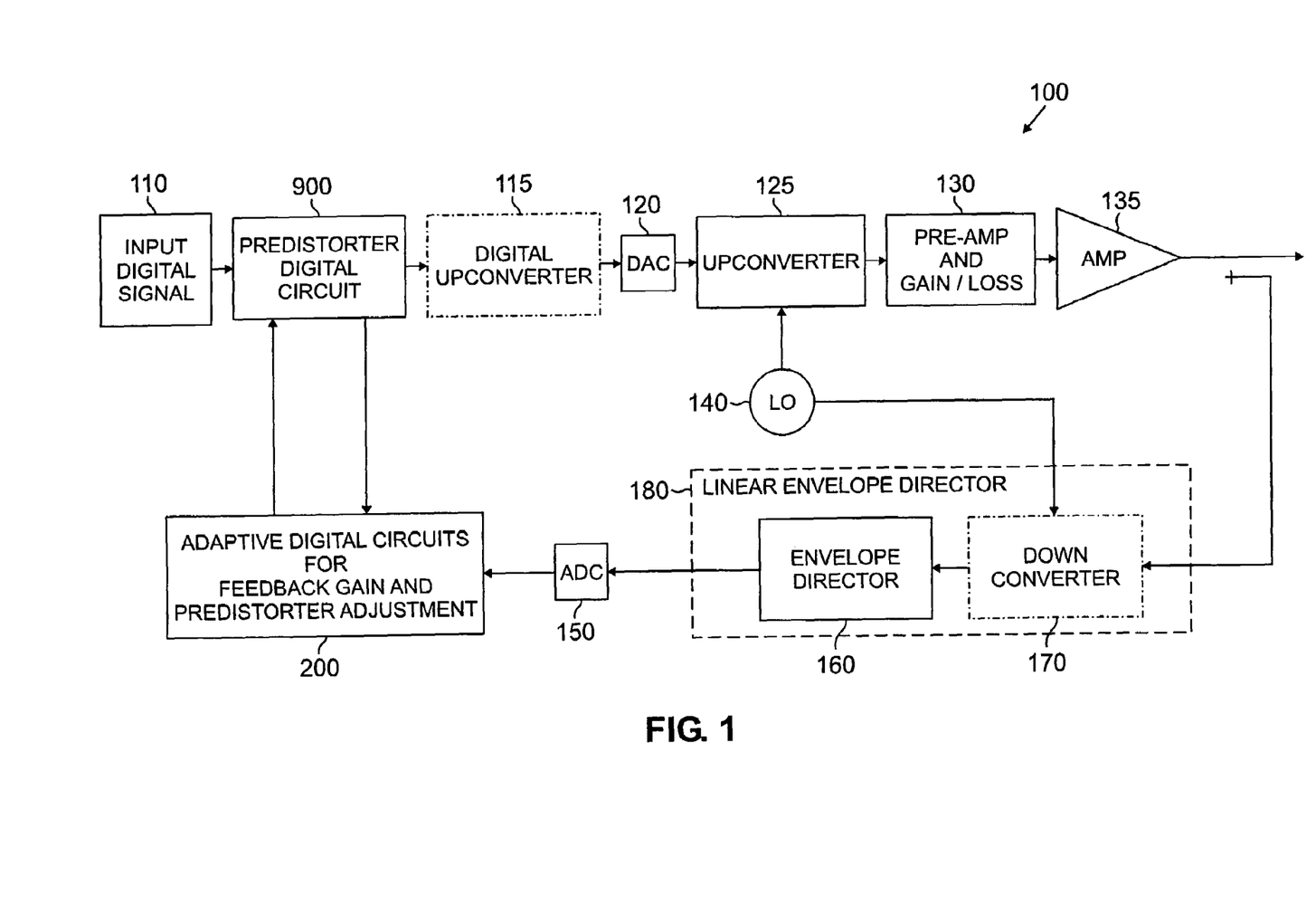
FIG. 1 is a schematic block diagram of a predistortion amplification system incorporating features of the present invention.

FIG. 1 is a schematic block diagram of a predistortion amplification system 100 incorporating features of the present invention. As shown in FIG. 1, the predistortion amplification system 100 receives a digital input signal 110 that is applied to a predistorter 900, discussed further below in conjunction with FIG. 6, and an optional digital upconverter 115. The upconverted digital signal is then converted to an analog system by a digital-to-analog converter 120.

The analog signal is applied to another upconverter 125 that modulates the analog signal using a local oscillating frequency outputted from a local oscillator 140. The signal is preamplified at stage 130 to achieve a desired gain or loss before being applied to the primary amplifier 135. The amplifier 135 generates an amplified output signal and typically transmits it to a transmission antenna (not shown).

The amplified output signal from the output of the amplifier 135 is also applied in a feedback loop to a linear envelope detector 180 that optionally comprises a down converter 170 and an envelope detector 160. The down converter 170 demodulates the feedback signal using the local oscillating frequency outputted from the local oscillator 140. The envelope detector 160 samples the output envelope of the amplifier 135. The sampled output envelope signal is applied to an analog-to-digital converter 150. It is noted that an alternate implementation can employ instantaneous output power levels instead of, or in addition to, the output envelope signal.

The digital envelope signal is applied to a set of adaptive digital circuits 200, discussed further below in conjunction with FIG. 2, that incorporate features of the present invention. According to one aspect of the invention, discussed further below, the predistorter 900 uses a non-linear gain (NLG) parameter that is adjusted by the adaptive digital circuits 200. Generally, the predistorter 900 compares the digital input signal 110 and the digital envelope signal (representing the output of the amplifier 135) to generate a predistorted signal that compensates for the distorted components of the amplified output signal.

As discussed hereinafter, the predistorted signal is based on an error signal, that may, for example, be the difference between the digital envelope signal (representing the output of the amplifier 135) and the digital input signal 110. The error signal provides information regarding the effect on the output of the predistortion and allows the predistortion to be adjusted to achieve less distortion in the digital envelope signal (representing the output of the amplifier 135).

As previously indicated, the present invention provides a predistorter that compensates for non-linearities in the amplifier 135. Generally, the predistorter provides an inverse of the non-linearity of the amplifier 135. Thus, the disclosed predistorter is based on a model of the amplifier 135, discussed below in a section entitled "Modeling of Nonlinear Amplifier System," that models such non-linearities. The disclosed predistorter is based on an inverse of this amplifier model. According to another aspect of the invention, the disclosed predistorter 900 employs static coefficients for the inverse of this amplifier model and adjusts the NLG parameter to generate a predistorted signal that compensates for the distorted components of the amplified output signal.

While the present invention is illustrated in the context of RF amplifiers, the predistortion techqniques described herein can be applied to any amplifiers, as would be apparent to a person of ordinary skill in the art, based on the present discussion.

Figure 2:
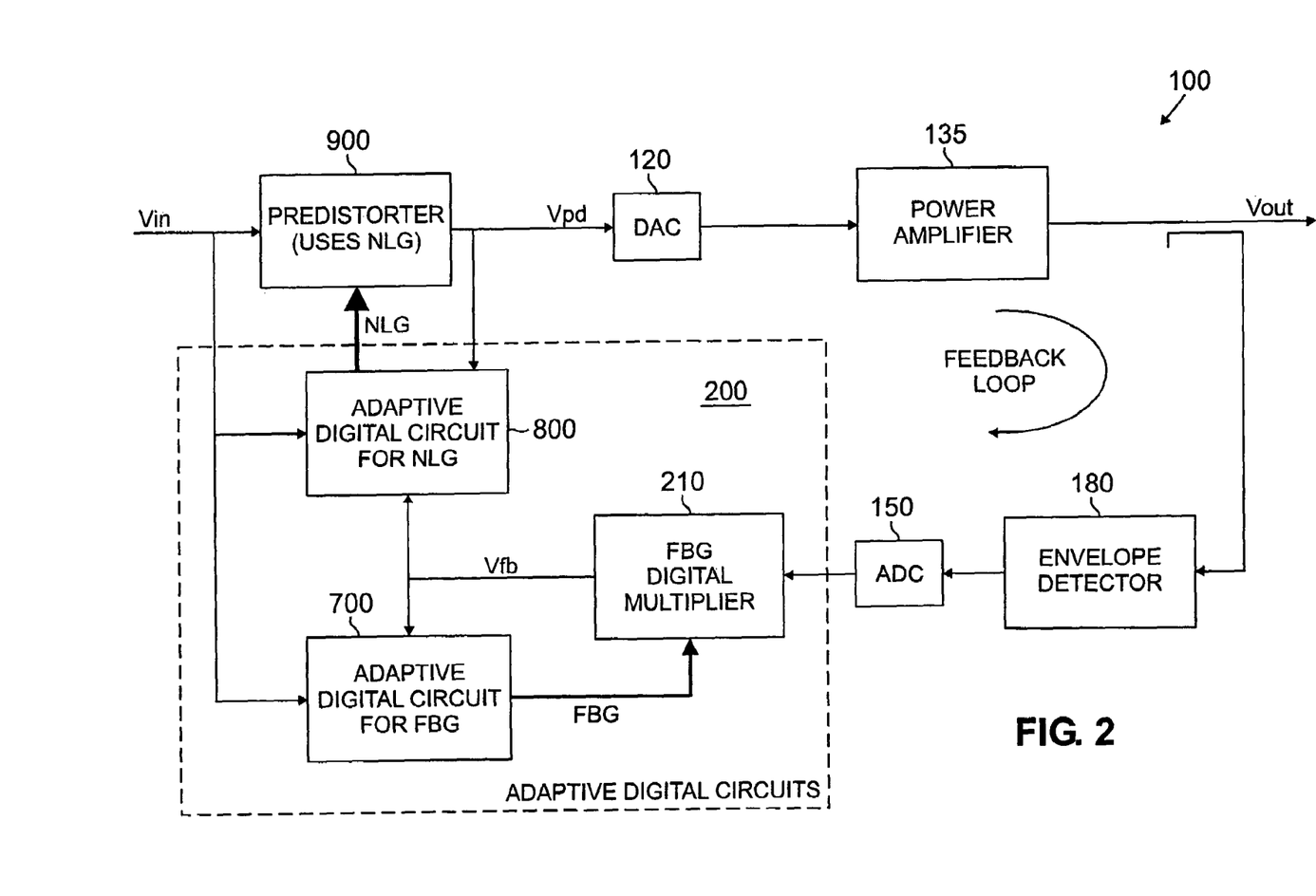
FIG. 2 is a schematic block diagram illustrating the predistortion amplification system of FIG. 1 in further detail.

FIG. 2 is a schematic block diagram illustrating the predistortion amplification system 100 of FIG. 1 in further detail. In particular, FIG. 2 provides additional details on the adaptive digital circuits 200 that were first introduced in FIG. 1 and the manner in which the adaptive digital circuits 200 are interconnected with the predistorter 900 and envelope detector 180 (through the analog-to-digital converter 150).

According to one aspect of the invention, the adaptive digital circuits 200 adapt just two variables: a nonlinear gain parameter (NLG) and a feedback gain parameter (FBG). In this manner, the predistortion adaptation can act very quickly and compensate for slow memory effects due to thermal time constants. Generally, the nonlinear gain parameter adapts the amount of nonlinearity that the predistorter 900 produces. The feedback gain parameter determines and compensates for the small-signal (i.e., linear) gain of the entire feedback loop so that the expansion or compression of the power amplifier 135 can be correctly measured.

Thus, as shown in FIG. 2, the adaptive digital circuits 200 includes an FBG digital multiplier 210, an adaptive digital circuit for FBG 700, discussed further below in conjunction with FIG. 7, and an adaptive digital circuit for NLG 800, discussed further below in conjunction with FIG. 8. The FBG value is applied to the FBG digital multiplier 210 so that the entire feedback loop gain, as seen by the NLG adaptive circuitry 800, is unity.

Modeling of Nonlinear Amplifier System

It is well known that amplifiers, such as the amplifier 135, introduce AM/AM (amplitude modulation) and AM/PM (phase modulation) distortion. In order to synthesize the predistorter inverses for the amplifier AM/AM and AM/PM distortion components, a mathematical model of the amplifier 135 is required. The amplifier model can be obtained, for example, from measurements on the amplifier 135. To model the amplifier 135, the AM/AM and AM/PM data points are required for a variety of output power levels. Once this data is obtained, mathematical models of the AM/AM and AM/PM can be derived, using known techniques. The measured amplifier input and output power levels can optionally be normalized so that the highest measured input or output power is zero dB (providing equivalent voltage ranges of 0 to 1).

Figure 3:
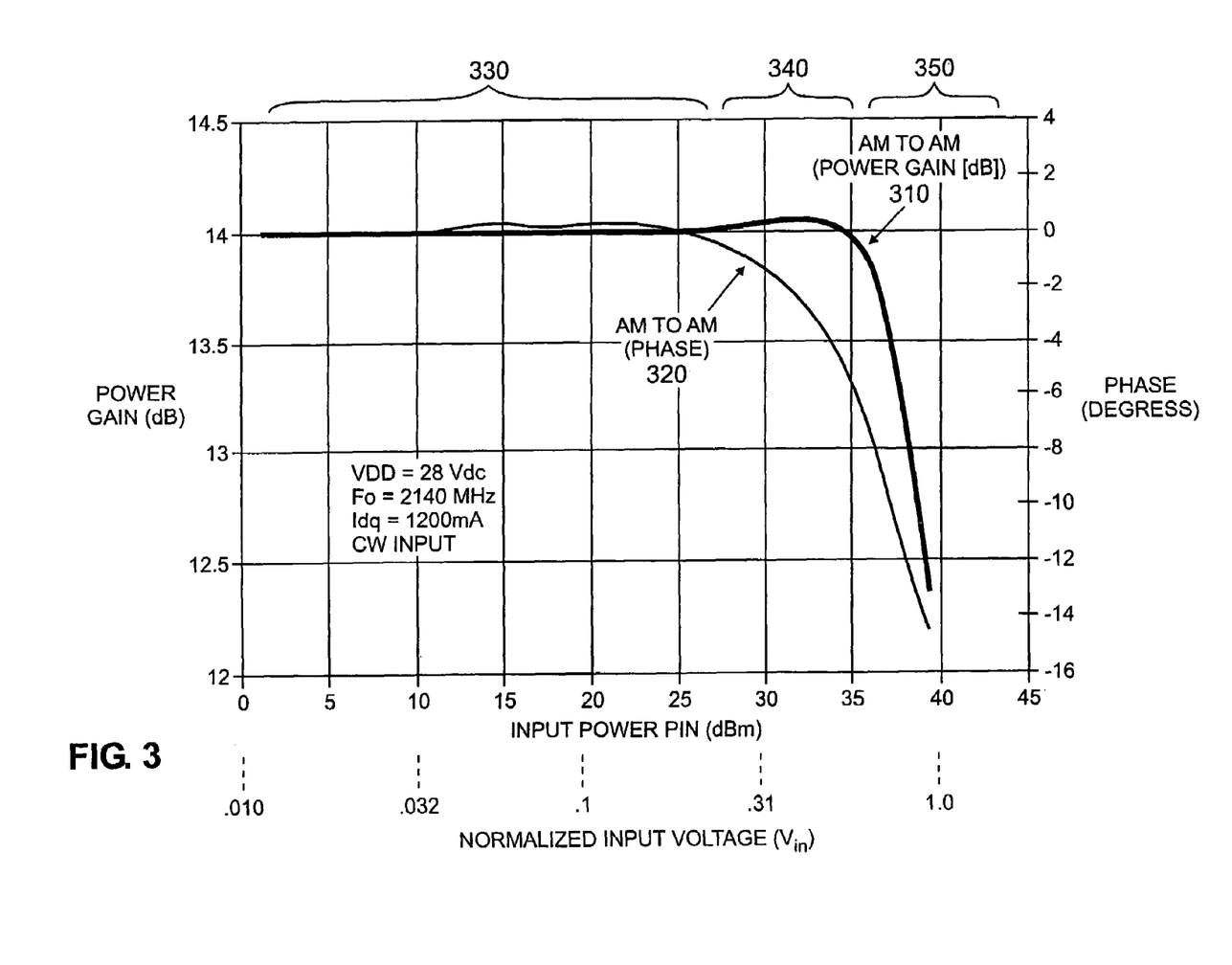
FIG. 3 illustrates an exemplary AM/AM characteristic and AM/PM characteristic for the amplifier of FIG. 1.

FIG. 3 illustrates an exemplary AM/AM characteristic 310 and AM/PM characteristic 320 for an amplifier 135, such as the AGR 21125 (2.1 GHz, 125 Watt) transistor, commercially available from Agere Systems, Inc. of Allentown, Pa. The measured characteristics 310, 320 for the exemplary AGR 21125 transistor are shown in FIG. 3. The transistor data should extend at least to the saturated power level of the transistor and perhaps several dB beyond this level, to allow accurate characterization for the high peak-to-average ratios of WCDMA and similar signals.

As shown in FIG. 3, the exemplary amplifier 135 exhibits a linear characteristic in a small signal zone 330, an increase in power gain in an expansion zone 340, and a decreased power gain in a compression zone 350 as the input power is increased. Thus, as apparent from FIG. 3, the output power gain is not constant as the input power is increased. The predistorter 900 of the present invention attempts to compensate for the non-linearities. As discussed below in a section entitled "FBG and NLG Adaptation Process," the adaptive predistortion techniques of the present invention adjust the feedback gain parameter in the small signal zone 330 and adjust the nonlinear gain parameter in the compression zone 350. Typically, communication devices must "back off" on the input power to avoid the expansion zone 340. With the improved efficiency provided by the present invention, it has been observed that the back off is improved by 8 dB while maintaining the necessary ACPR specification.

AM/AM Mathematical Model

In one exemplary implementation, the AM/AM characteristic was obtained using the Matlab function "polyfit." The exemplary amplifier AM/AM polynomials can be represented as follows:

$$z = b1*y + b3*y^3 + b5*y^5 + b7*y^7 + b9*y^9$$

where y is the amplifier input voltage and z is the amplifier output voltage.

Two exemplary techniques were used to determine the predistorter AM/AM polynomial coefficients, b. The first iterative technique results for iteratively forcing successively higher order terms of the tandem predistorter-transistor nonlinear polynomial to zero. This technique is intuitive in that ideally one would like the tandem system to have no nonlinear terms. Another technique, referred to as the "term-wise" technique, makes each predistorter nonlinear coefficient correspond to the negative distortion of the corresponding polynomial coefficient from the amplifier. Generally, the "term-wise" technique handles each nonlinearity term one at a time. For the sample amplifier characteristic used, the second term-wise technique was observed to perform better.

a. Iterative Technique

With the first iterative technique, the iterative inverse is obtained by forming the tandem polynomial:

$$z = b1*y + b3*y^3 + b5*y^5 + \ldots$$

where:

$$y = x + a3*x^3 + a5*x^5 + \ldots$$

Keeping just the terms shown above gives:

$$z = b1*(x + a3*x^3 + a5*x^5) + b3*(x + a3*x^3)^3 + b5*(x + a3*x^3 + a5*x^5)^5.$$

To force the third order tandem distortion to zero requires $$b1*a3*x^3 + b3*x^3 = 0 \text{ or } a3 = -b3/b1.$$

To obtain the fifth order coefficient, the original equation and the 3rd order solution are used to give:

$$a5 = -b5/b1 + 3*(b3^2)/(b1^2)$$

This process can be extended to successively higher powers of x in the tandem power series. The solutions can be obtained with a symbolic mathematics program, such as provided with the Matlab package.

The use of the Matlab symbolic mathematics features resulted in the following expressions for the coefficients of the predistorter polynomial in the amplifier model:

$$a3 = -b3/b1 \text{ \{where } a3 \text{ handles third order nonlinearities\};}$$

$$a5 = -(-3*b3^2 + b5*b1)/b1^2;$$

$$a7 = -(-8*b5*b3*b1 + 12*b3^3 + b7*b1^2)/b1^3;$$

$$a9 = -(-55*b3^4 + 55*b5*b3^2*b1 - 5*b5^2*b1^2 - 10*b7*b3*b1^2 + b9*b1^3)/b1^4;$$

$$a11 = (-273*b3^5 + 364*b5*b3^3*b1 - 78*b3*b5^2*b1^2 - 78*b7*b3^2*b1^2 + 12*b7*b1^3*b5 + 12*b9*b3*b1^3)/b1^5.$$

The predistorter inverse formed by this polynomial is termed the iterative inverse. The iterative inverse led to an alternating series representation. Thus, the iterative inverse, could be improved by replacing a11 by a11/3. This reduction in a11 removed some of the error resulting from neglecting higher order nonlinearities. The inverse modified in this way is termed the modified iterative inverse.

b. Term Wise Technique

With the term wise technique, each term of the predistorter distortion is simply set equal to the negative of the corresponding amplifier distortion. Thus, from the iterative results above, it can be seen that:

$$a3 = -b3/b1;$$

$$a5 = -b5/b1;$$

$$a7 = -b7/b1;$$

$$a9 = -b9/b1;$$

a11=0 (since b11=0 for the amplifier model).

c. AM/AM Polynomial Coefficients for Exemplary Amplifier

For the exemplary AGR 21125 characteristic discussed above in conjunction with FIG. 3, a 9th order model was found to provide the best fit to the extended AM/AM data 310 for the amplifier 135. In one novel variation of the conventional amplifier model discussed herein, the predistorter AM/AM polynomial coefficients for the amplifier model resulting from the $9^{th}$ order fit can thus be expressed as follows:

b1=1.1949;
b3=0.2588;
b5=−0.7982;
b7=0.4158;
b9=−0.0697.

AM/PM Mathematical Model

In one exemplary implementation, the AM/PM characteristic was obtained using the Matlab function "polyfit." The exemplary amplifier AM/PM polynomials can be represented as follows:

$$p = p0 + p2*y^2 + p4*y^4 + p6*y^6 + p8*y^8$$

where y is the amplifier input voltage and p is the output phase in radians. Thus, the coefficients for the predistorter 900, discussed further below in conjunction with FIGS. 9A through 9C, can be expressed as p2, p4, p6 and p8. It is noted that p0 is a static phase shift that causes no signal distortion and can be neglected. The phase is represented by a small angle approximation which in conjunction with the odd order distortion results in the phase being represented by an even order polynomials. The order of the phase is always one less than the corresponding distortion order (for example, 5th order distortion results in 4th order phase distortion).

For the exemplary AGR 21125 characteristic discussed above in conjunction with FIG. 3, it was observed that the 5th order model (4th order phase) provides the best fit to the amplifier extended data. In one novel variation of the conventional amplifier model discussed herein, the predistorter AM/PM polynomial coefficients for the amplifier model resulting from the $5^{th}$ order fit can thus be expressed as follows:

p0=0.0071;
p2=−0.3117;
p4=0.0437.

Figure 4:
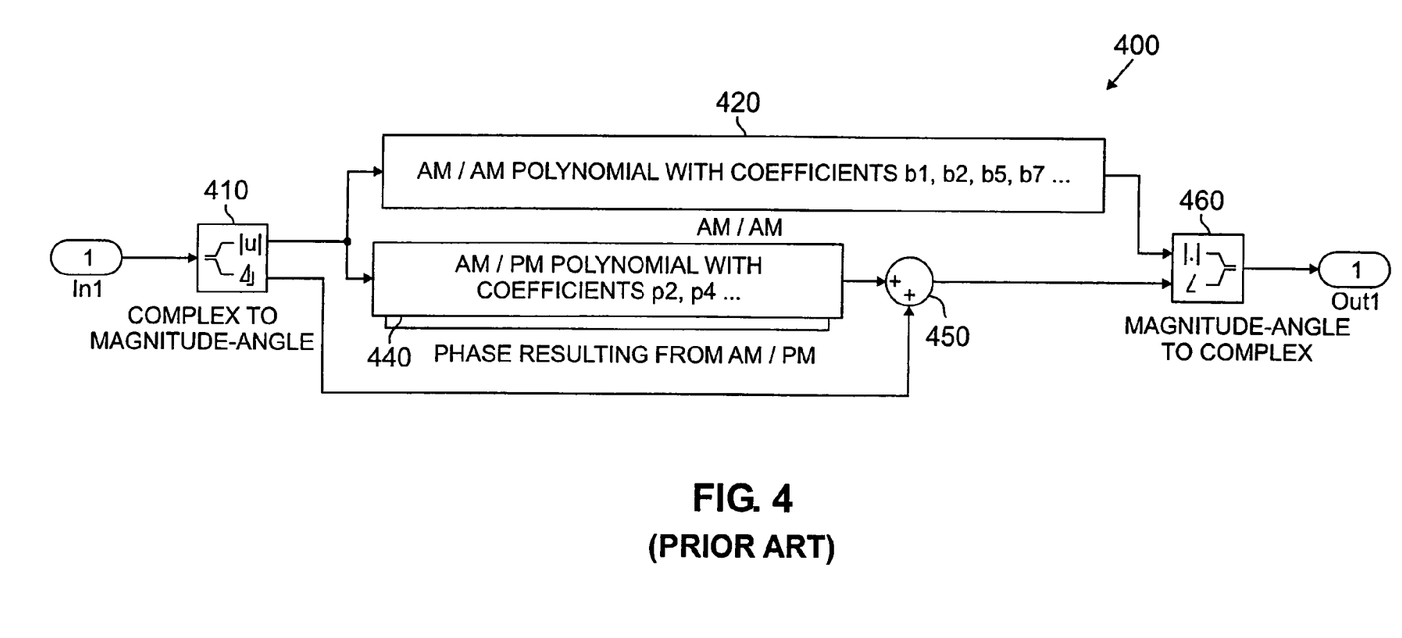
FIG. 4 is a schematic block diagram of an exemplary conventional model of the amplifier of FIG. 1.

FIG. 4 is a schematic block diagram of an exemplary conventional model 400 of the amplifier 135 of FIG. 1, where the amplifier 135 is embodied as the AGR21125. As shown in FIG. 4, the model 400 includes a complex-to-magnitude angle (C to MA) block 410 that converts between IQ and magnitude-angle representations of the complex envelope signal. An AM/AM correction block 420 implements the predistorter AM/AM polynomial coefficients for the amplifier model from the $9^{th}$ order fit that was discussed above. An AM/PM correction block 440 implements the predistorter AM/PM polynomial coefficients for the amplifier model from the $5^{th}$ order fit that was discussed above. The output of the AM/PM correction block 440 is added to the magnitude-angle representation of the input signal, Vin, by an adder 450. Finally, a magnitude angle-to-complex (MA to C) block 460 converts between the magnitude-angle and IQ representations of the signal.

Model Inverse

As previously indicated, the present invention provides a predistorter that compensates for non-linearities in the amplifier 135. Generally, the predistorter provides an inverse of the non-linearity model of the amplifier 135.

Figure 5:
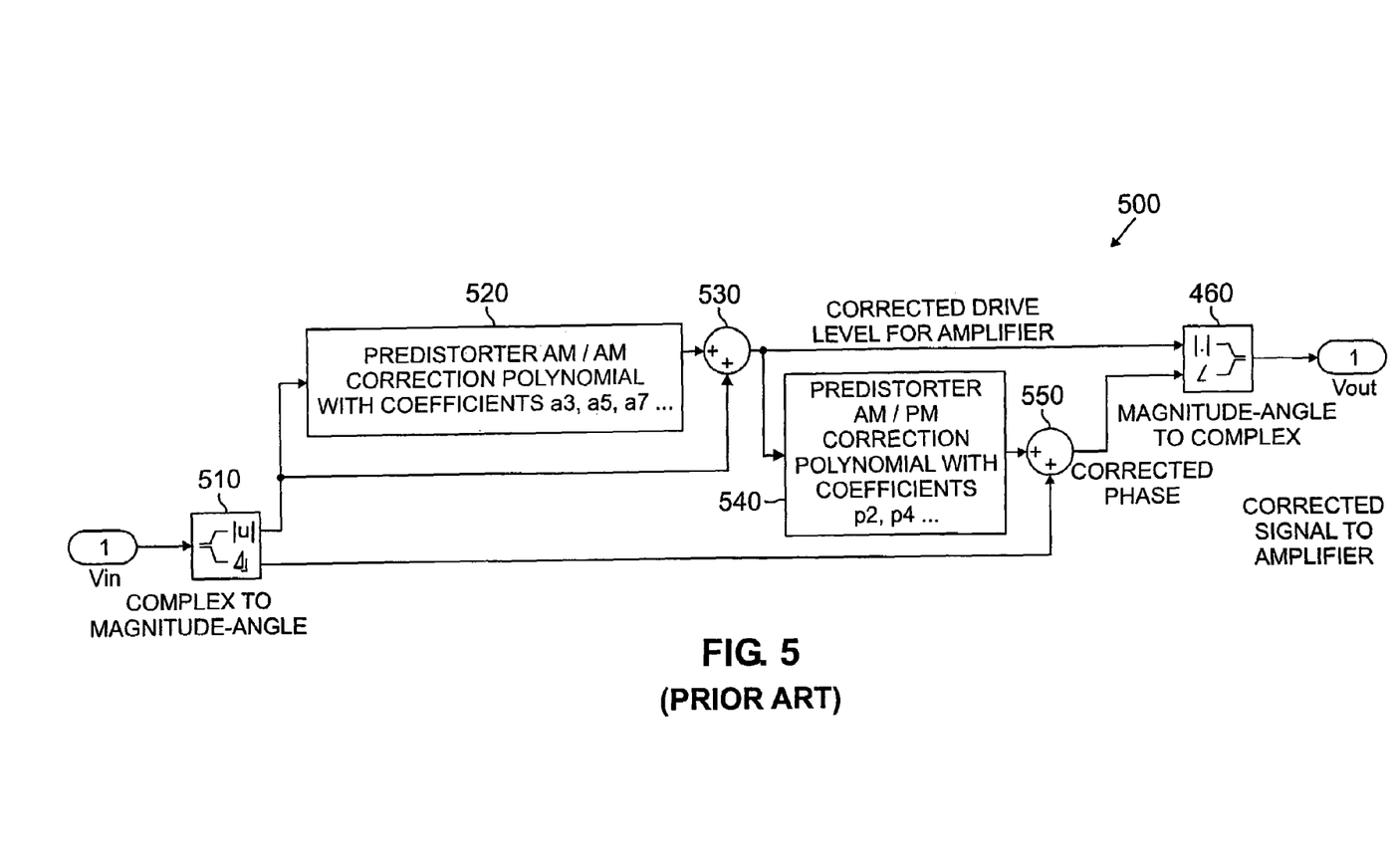
FIG. 5 is a schematic block diagram of a model of an exemplary conventional predistorter.

FIG. 5 is a schematic block diagram of a model of an exemplary conventional predistorter 500 embodied using the predistorter architecture proposed in Michael Faulkner and Mats Johansson, "Adaptive Linearization Using Predistortion—Experimental Results," IEEE Trans. On Vehicular Technology, Vol. 43 No. 2, May 1994, incorporated by reference herein. The predistorter 500 implements the inverse of the amplifier 135 of FIG. 1, where the amplifier 135 is embodied as the AGR21125.

In the exemplary predistorter 500 shown in FIG. 5, the AM/AM correction 520 is first applied to the input signal using an adder 530 and then the corrected amplitude drive level is used to index an AM/PM correction table 540 or function that is the negative of the measured AM/PM characteristic of the amplifier 135. The AM/PM correction 540 is the negative of the amplifier AM/PM phase characteristic discussed above. The AM/AM correction 520 is the term-wise inverse discussed above. In one novel variation of the conventional amplifier model discussed herein, the predistorter coefficients for this inverse can be shown to be:

a3=−0.0518 a5=0.1596 a7=−0.032 a9=0.0139 a11=0.

Figure 6:
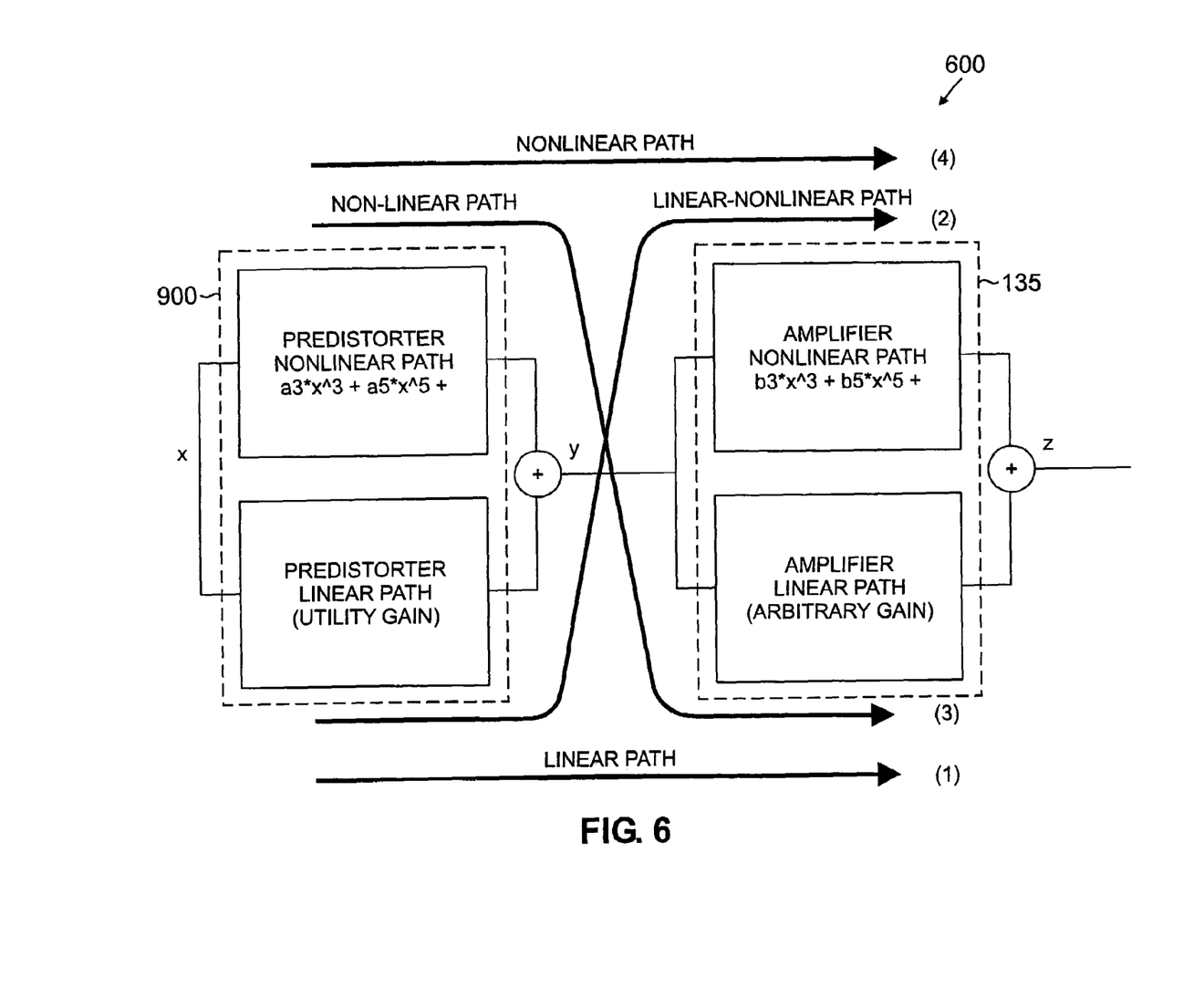
FIG. 6 illustrates four signal paths through the predistorter and amplifier of FIG. 1.

FIG. 6 illustrates four signal paths (1) through (4) through the predistorter 900 and amplifier 135 (FIG. 1). As shown in FIG. 6, there is a first linear path (1) through the predistorter 900 and amplifier 135. A second path (2) is through the linear region of the predistorter 900 and the non-linear region of the amplifier 135. A third path (3) is through the non-linear region of the predistorter 900 and the linear region of the amplifier 135. A final path (4) is through the non-linear region of the predistorter 900 and the non-linear region of the amplifier 135.

It is noted that the iterative inverse discussed above linearizes all four paths (1) through (4). The term-wise inverse linearizes paths (1) through (3) and neglects path (4).

Adaptive Digital Circuits

As previously indicated, the adaptive digital circuits 200 of FIG. 2 adapt just two variables: a nonlinear gain parameter (NLG) and a feedback gain parameter (FBG). Again, the nonlinear gain parameter adapts the amount of nonlinearity that the predistorter 900 produces. The feedback gain parameter determines and compensates for the small-signal (i.e., linear) gain of the entire feedback loop so that the expansion or compression of the power amplifier 135 can be correctly measured. The adaptive digital circuits 200 includes an FBG digital multiplier 210, an adaptive digital circuit for FBG 700, shown in FIG. 7, and an adaptive digital circuit for NLG 800, shown in FIG. 8.

Figure 7:
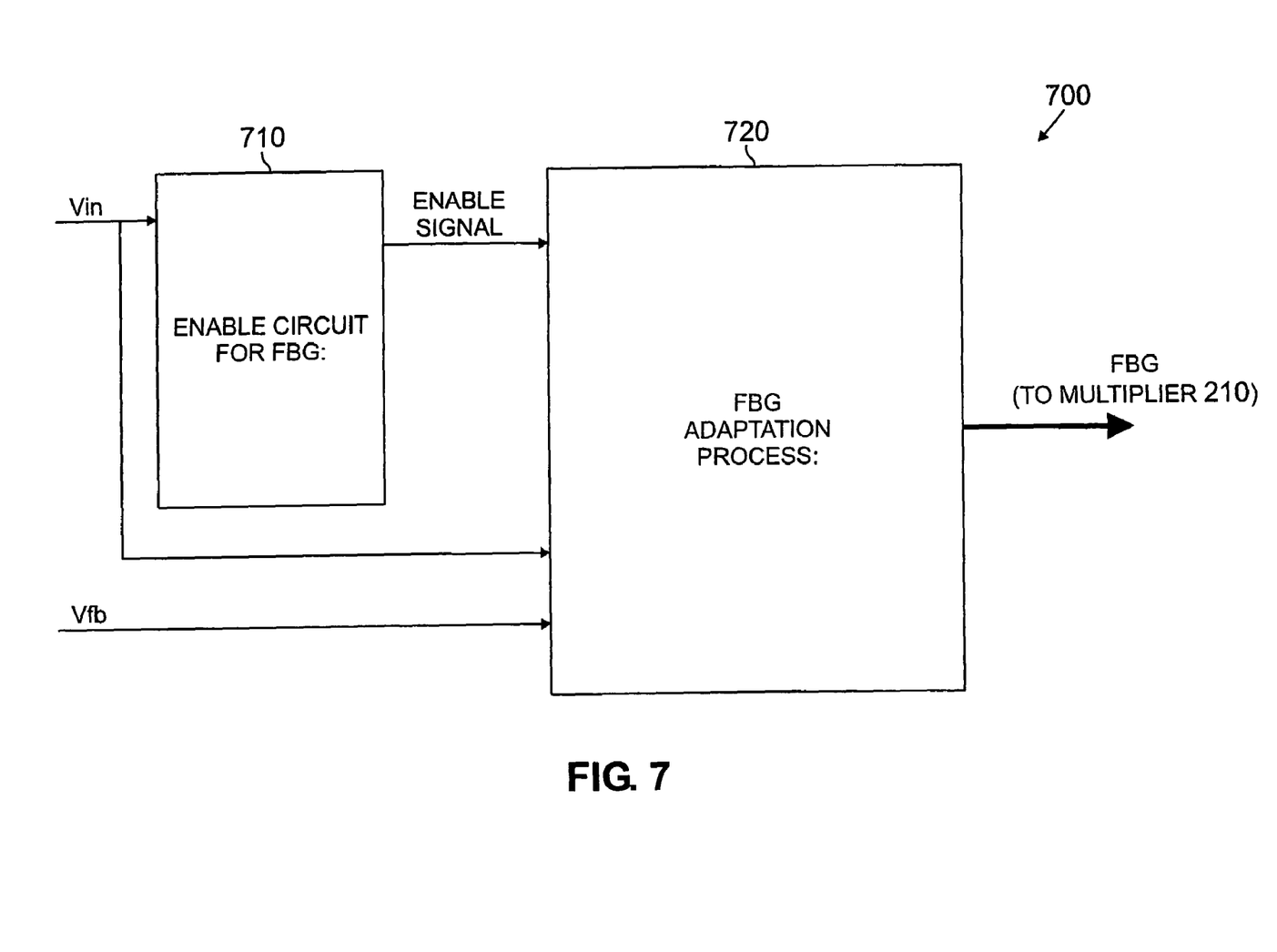
FIG. 7 is a schematic block diagram illustrating the adaptive digital circuit for FBG of FIG. 2 in further detail.

FIG. 7 is a schematic block diagram illustrating the adaptive digital circuit for FBG 700 of FIG. 2 in further detail. The feedback gain parameter determines and compensates for the small-signal (linear) gain of the entire feedback loop so that the expansion or compression of the amplifier 135 can be correctly measured. Without this adaptive loop, the NLG parameter cannot be converged. The FBG value is applied to a feedback-loop gain-multiplier 210 (FIG. 2) so that the entire feedback loop gain, as seen by the NLG adaptive circuitry 800, is approximately unity. The FBG adaptive loop is designed so that the small-signal (linear) gain between Vin and Vfb is approximately equal to one (1). This allows the predistorter adaptive circuit for NLG 800 to be able to distinguish between expansion and compression in Vfb.

As shown in FIG. 7, the adaptive digital circuit for FBG 700 includes an enable circuit 710 and an FBG adaptation process 720. In an exemplary implementation, the enable signal is true when Vin is between 0.05 and 0.15 Volts. Thus, the exemplary adaptive digital circuit for FBG 700 allows FBG adaptation only when the signal level is between 0.05 and 0.15 volts (small signal region only). Further, when the enable signal is true, the current FBG value is incremented by (Vin−Vfb) (i.e., the error value) times a feedback gain multiplier. In this manner, the FBG adaptation process 720 adapts the feedback gain multiplier 210 so that the feedback loop for the predistorter has approximately a unity small signal gain. Generally, the purpose of the FBG circuit 710 and adaptation process 720, as shown in FIG. 7, is to allow the NLG adaptation (to be shown in FIG. 8) to work properly by adapting the gain around the entire loop to be unity.

Figure 8:
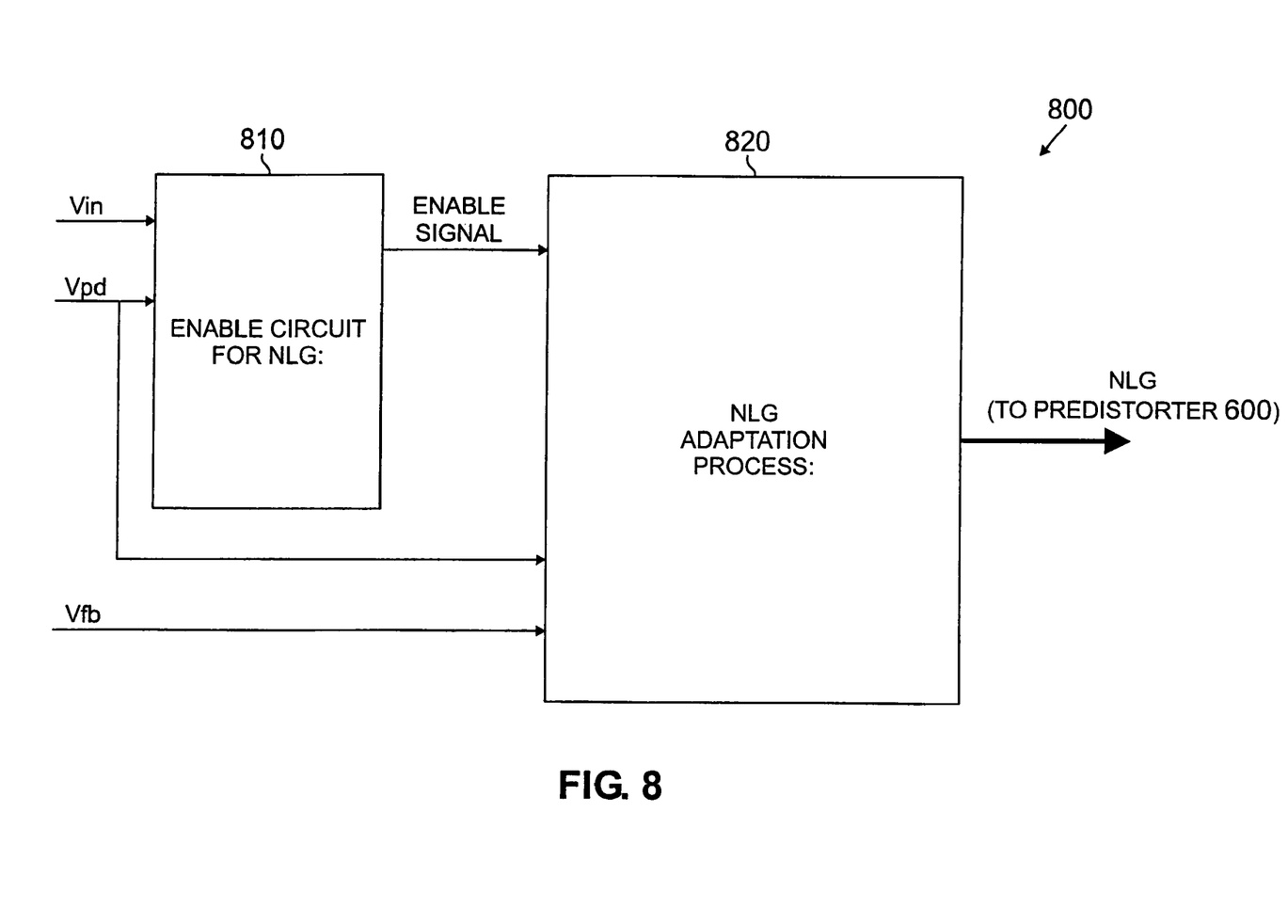
FIG. 8 is a schematic block diagram illustrating the adaptive digital circuit for NLG of FIG. 2 in further detail.

FIG. 8 is a schematic block diagram illustrating the adaptive digital circuit for NLG 800 of FIG. 2 in further detail. Generally, the nonlinear gain parameter adapts the amount of nonlinearity that the predistorter produces. The NLG adaptive loop, shown in FIG. 8, is designed so that, at higher levels of Vin, the squared difference between Vin and Vfb (i.e., the error signal) is minimized. This minimizes the AM/AM nonlinearity of the predistorter and amplifier.

As shown in FIG. 8, the adaptive digital circuit for NLG 800 includes an enable circuit 810 and an NLG adaptation process 820. In an exemplary implementation, the enable signal is true when Vpd is greater than Vin, Vin is greater than 0.56, and Vin is less than 1.2 (chosen based on the exemplary predistorter-amplifier single-tone AM/AM curves discussed above and should be chosen at a Vin value where the predistorter inverse is still well behaved). Thus, the exemplary adaptive digital circuit for NLG 800 allows NLG adaptation only when the the predistorter 900 is canceling compression. Further, when the enable signal is true, the current NLG value is updated by Sgn(Vfb−Vpd) times (Vfb−Vpd)^2 times a feedback gain multiplier. Thus, the NLG adaptation process 820 determines the nonlinear gain of the predistorter 900.

A feedback loop delay parameter (FBD) determines and compensates for the delay of the feedback loop, in a known manner. The FBD parameter removes the delay of the feedback loop so that inputs and outputs of the loop can be correctly compared. A correlation technique can be used to determine the feedback loop delay. Inputs to the feedback loop will be delayed by the result of the correlation measurement when they are compared with the feedback loop outputs.

FBG and NLG Adaptation Process

The FBG adaptation process 720 and NLG adaptation process 820 discussed above in conjunction with FIGS. 7 and 8, respectively, collectively operate to avoid the expansion zone 340 (FIG. 3). The FBG and NLG parameters discussed above share the same feedback loop and both must be converged.

To minimize interactions between the FBG and NLG adaptive circuits 700, 800, the FBG parameter is adapted only when the amplifier is driven in a "small signal" range 330 (FIG. 3). In the exemplary embodiment, this range is defined by Vin having a value between 0.05 and 0.15 volts. In this small signal range, the amplifier nonlinearities have minimal impact on the value of FBG. The range 0 to 0.05 is not used since, in a quantized implementation, the effective signal to quantization-noise ratio becomes very low. Further, the NLG parameter is adapted only when Vin is greater than 0.56 volts and the predistorter 900 is compensating compression. That is, when Vpd is greater than Vin. This is normally the case for Vin approaching or exceeding 1.

Thus, adaptation is not performed for input values, Vin, below 0.05, since the signal is too small for a quantized adaptation. FBG adaptation is performed in the exemplary small signal range of 0.05 to 0.15 volts. No adaptation is performed in the exemplary expansion zone 340. NLG adaptation is performed in the exemplary compression zone (only when Vin is greater than 0.56 volts and the predistorter 900 is compensating compression). Although it would be desirable to adapt NLG when the predistorter is compensating expansion (zone 340), the stability of the convergence could not be guaranteed. Thus, NLG is currently converged only when the predistorter is compensating compression in zone 350.

In the exemplary embodiment, NLG is adapted based only on the AM/AM non-linearities (and not AM/PM feedback or adaptation).

Using NLG Parameter in Predistorter

Figure 9A:
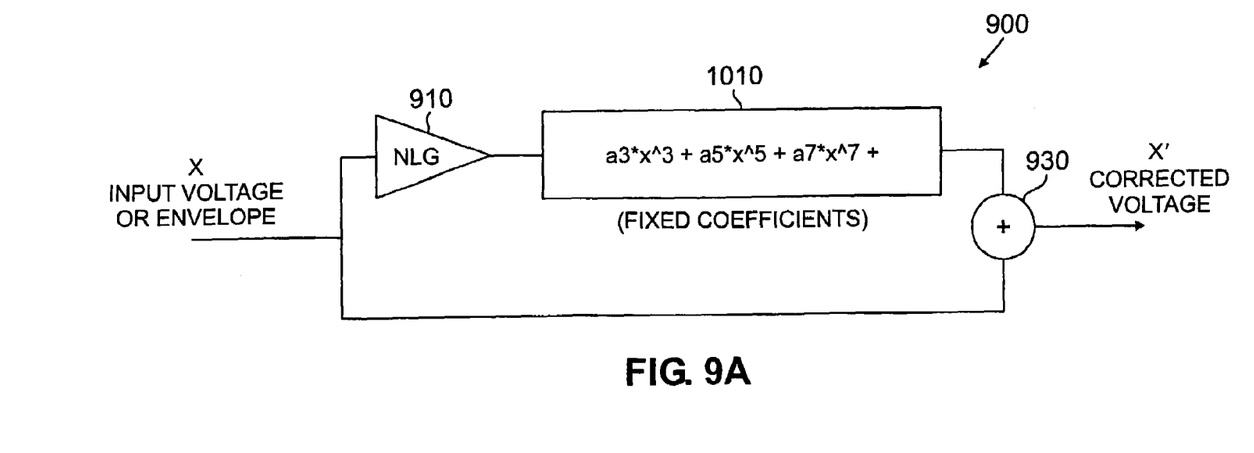
FIGS. 9A through 9C are schematic block diagrams of exemplary implementations of the predistorter of FIG. 1, each incorporating features of the present invention.
Figure 9B:
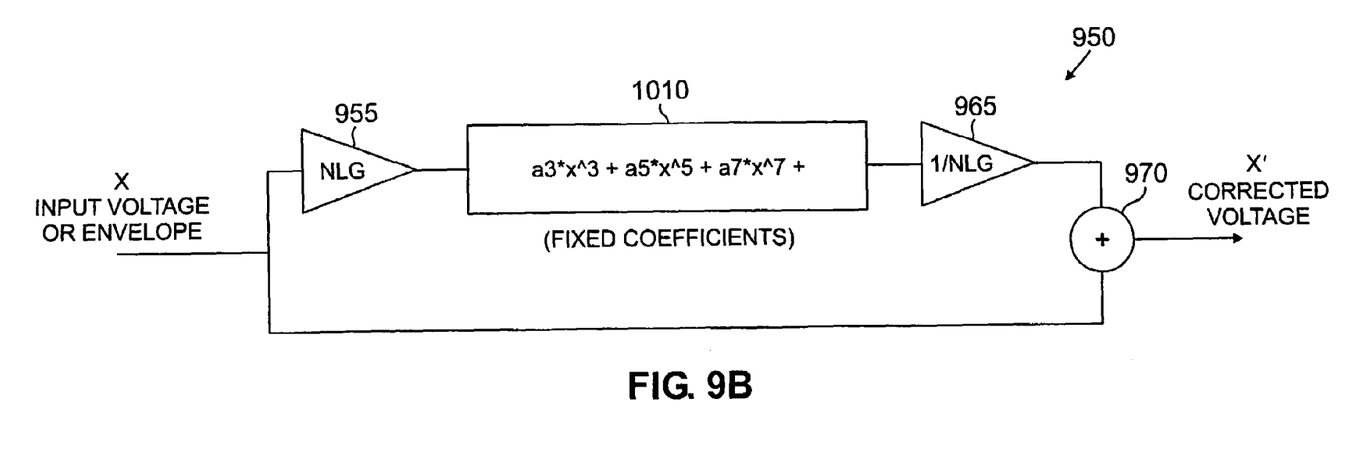

FIG. 9A is a schematic block diagram of an exemplary predistorter 900 incorporating features of the present invention that employs an inverse model of the AM/AM characteristic of the amplifier 135. The exemplary predistorter 900 uses only a pre-multiplier 910 that multiplies an input voltage times the current NLG parameter before application to a AM/AM characteristic correction table 1010, discussed further below in conjunction with FIG. 10A. The magnitude corrected voltage is obtained at the output of an adder 930. The NLG pre-multiplier 910 scales the input to all of the nonlinear AM/AM terms. FIG. 9B is a schematic block diagram of an alternate exemplary predistorter 950 incorporating features of the present invention that employs an inverse model of the AM/AM characteristic of the amplifier 135. The exemplary predistorter 950 uses an NLG pre-multiplier 955 and an NLG post-divider 965. The magnitude corrected voltage is obtained at the output of an adder 970. The alternate predistorter architecture 950 accommodates variations in gain anywhere around the entire feedback loop, for example, changes in the intermediate gain between the predistorter 900 and the power amplifier 135. In particular, the predistorter 950 of FIG. 9B is robust to such gain changes in the amplifier 135, preamplifier 130 and the feedback loop following the amplifier 135 (e.g., the envelope detector 180, FBG Digital Multiplier 210 and adaptive NLG circuit 800). The gain changes may be the result of, for example, temperature changes or aging.

According to one aspect of the invention, the predistorters 900, 950 of FIGS. 9A and 9B employ static AM/AM coefficients 1010 for the inverse of the amplifier model and relies on the adjustment of the NLG parameter applied to the NLG pre-multiplier 910, 955 and an NLG post-divider 965, if present, (as well as the FBG parameter in the feedback loop) to generate the predistorted signal that compensates for the distorted components of the amplified output signal.

The predistorter architecture 900, 950 for the AM/AM NLG parameter was developed by first observing the variation of the AM/AM characteristics of a group of amplifiers. The predistorter adaptation process 820 should adapt well to the observed range of AM/AM characteristics. The second configuration of FIG. 9B leaves the maximum expansion value at intermediate input voltage levels constant as NLG changes.

Figure 9C:
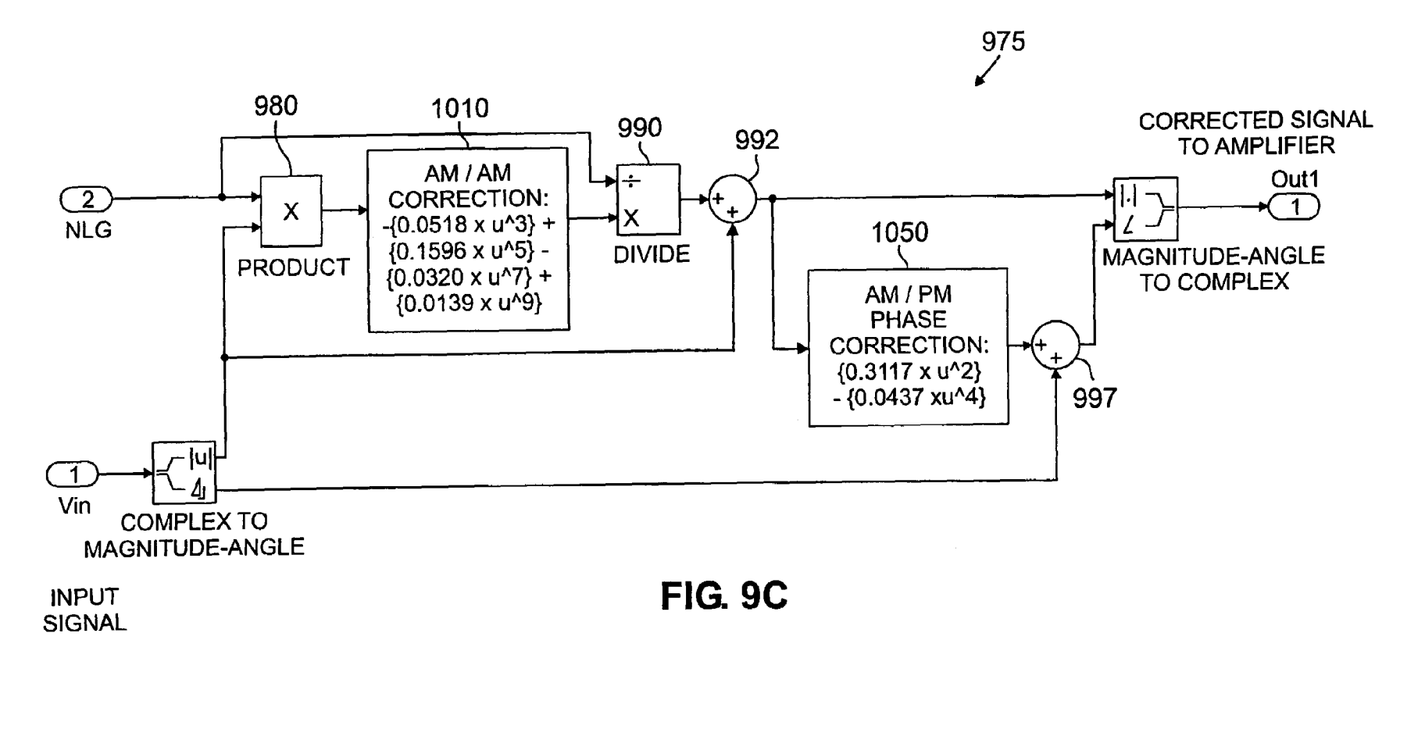

FIG. 9C is a schematic block diagram of an alternate exemplary predistorter 975 incorporating features of the present invention that employs an inverse model of the AM/AM and AM/PM characteristics of the amplifier 135. The exemplary predistorter 975 uses an NLG pre-multiplier 980 and an NLG post-divider 990, in a similar manner to FIG. 9B. The output of the NLG pre-multiplier 980 is applied to the AM/AM characteristic correction table 1010 in a manner described further below in conjunction with FIG. 10A, to generate a magnitude corrected voltage that is applied to the NLG post-divider 990. The output of the NLG post-divider 990, together with the input voltage, are summed by an adder 992, which provides a magnitude corrected drive level for the amplifier 135.

The output of the adder 992 is applied to the AM/PM characteristic correction table 1050 in a manner described further below in conjunction with FIG. 10B, to generate a phase corrected voltage. The output of the AM/PM characteristic correction table 1050, together with the input voltage, are summed by an adder 997, to provide a phase corrected drive level for the amplifier 135. The magnitude corrected voltage from the adder 992 and the phase corrected voltage from the adder 997 are applied to a magnitude angle-to-complex (MA to C) block that converts between the magnitude-angle and IQ representations of the signal.

Figure 10A:
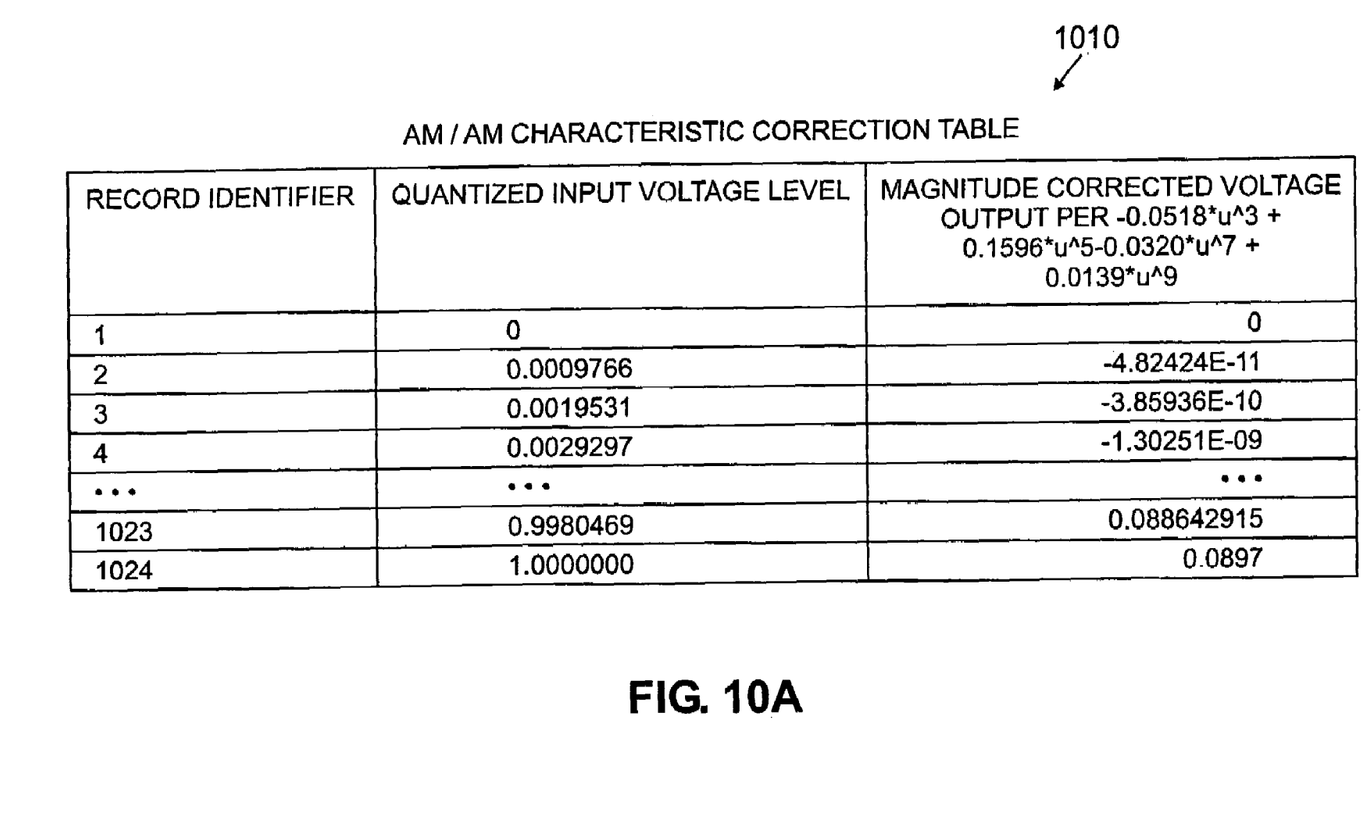
FIGS. 10A and 10B are sample tables from exemplary AM/AM and AM/PM characteristic corrections tables, respectively.

FIG. 10A is a sample table from an exemplary AM/AM characteristic correction table 1010. As shown in FIG. 10A, the exemplary AM/AM characteristic correction table 1010 includes a plurality of records, each associated with a different possible input voltage. In the exemplary implementation, the AM/AM characteristic correction table 1010 includes 1024 quantized entries (for normalized input voltages between 0 and 1 volt) that are indexed by a 10 bit address (based on the output of the NLG pre-multiplier 980). For each possible input voltage, the AM/AM characteristic correction table 1010 identifies the corresponding magnitude corrected output voltage (which may be stored, for example, as a 12 bit value). Generally, the magnitude corrected output voltages are obtained based on the static AM/AM coefficients for a given amplifier 135 at a given bias level. In an alternate implementation, the AM/AM characteristic correction table 1010 can be replaced with a set of multipliers that employ filter taps based on the static AM/AM coefficients to calculate the magnitude corrected output voltages in real time.

Figure 10B:
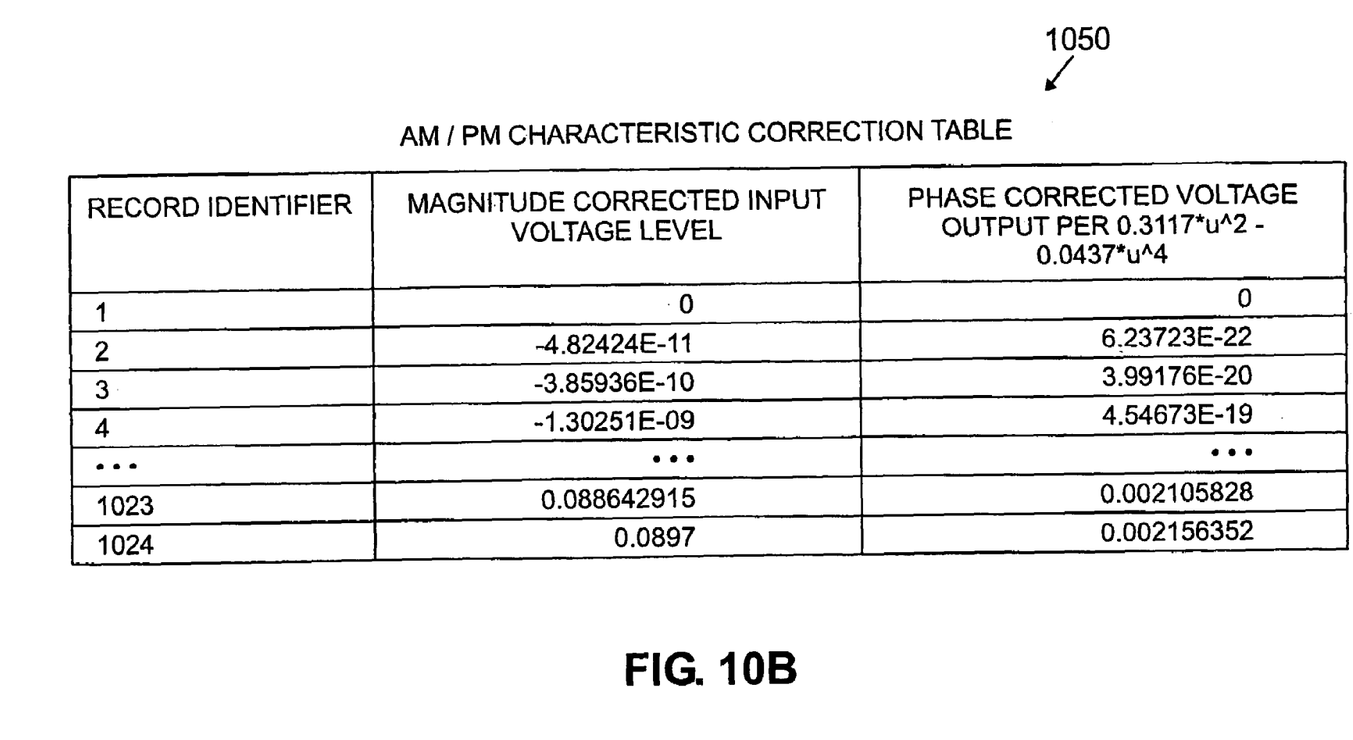

FIG. 10B is a sample table from an exemplary AM/PM characteristic correction table 1050. As shown in FIG. 10B, the exemplary AM/PM characteristic correction table 1050 includes a plurality of records, each associated with a different possible magnitude corrected input voltage. In the exemplary implementation, the AM/PM characteristic correction table 1050 includes 1024 quantized entries (for normalized voltages between 0 and 1 volt) that are indexed by a 10 bit address (based on the output of the adder 992). For each possible magnitude corrected input voltage, the AM/PM characteristic correction table 1050 identifies the corresponding phase corrected output voltage (which may be stored, for example, as a 12 bit value). Generally, the phase corrected output voltages are obtained based on the static AM/PM coefficients for a given amplifier 135 at a given bias level. In an alternate implementation, the AM/PM characteristic correction table 1050 can be replaced with a set of multipliers that employ filter taps based on the static AM/PM coefficients to calculate the magnitude corrected output voltages in real time.

The predistorter 900 and the adaptive circuits 200 may optionally be packaged together with additional components on an integrated circuit.

It is to be understood that the embodiments and variations shown and described herein are merely illustrative of the principles of this invention and that various modifications may be implemented by those skilled in the art without departing from the scope and spirit of the invention.

We claim:

1. A method for predistorting an input signal, comprising:
   predistorting said input signal based on one or more static coefficients representative of a non-linear distortion characteristic of an amplifier; and
   processing said input signal based on a non-linear gain parameter that reduces an error metric between said input signal and a feedback signal following said amplifier, wherein said non-linear gain parameter is adapted when said input voltage is above a threshold input voltage.

2. The method of claim 1, wherein said threshold input voltage identifies a compression zone.

3. The method of claim 1, wherein said nonlinear gain parameter adapts an amount of nonlinearity introduced by said predistorting step.

4. The method of claim 1, wherein said error metric comprises a squared difference between said input signal and said feedback signal following said amplifier.

5. The method of claim 1, further comprising the step of processing said input signal based on a feedback gain parameter.

6. The method of claim 5, wherein said feedback gain parameter compensates for a small-signal gain of a feedback loop that generates said feedback signal.

7. The method of claim 5, wherein said small-signal gain is approximately unity.

8. The method of claim 5, wherein said small-signal gain is a difference between said input signal and said feedback signal.

9. The method of claim 1, further comprising the step of applying said predistorted signal to said amplifier.

10. The method of claim 1, wherein said step of processing said input signal further comprises the step of multiplying said input signal by said non-linear gain parameter.

11. The method of claim 10, wherein said step of processing said input signal further comprises the step of dividing said input signal by said non-linear gain parameter.

12. The method of claim 1, wherein said non-linear distortion characteristic comprises an AM/AM characteristic.

13. The method of claim 1, wherein said non-linear distortion characteristic comprises an AM/PM characteristic.

14. The method of claim 1, further comprising the step of digitizing said input signal prior to said predistorting step.

15. A predistorter that processes an input signal, comprising:
    means for predistorting said input signal based on one or more static coefficients representative of a non-linear distortion characteristic of an amplifier; and
    means for processing said input signal based on a non-linear gain parameter that reduces an error metric between said input signal and a feedback signal following said amplifiers, wherein said nonlinear gain parameter adapts an amount of nonlinearity introduced by said predistorter.

16. The predistorter of claim 15, wherein said means for processing step is only performed when said input voltage is above a threshold input voltage.

17. The predistorter of claim 15, wherein said error metric is a squared difference between said input signal and said feedback signal following said amplifier.

18. The predistorter of claim 15, further comprising the step of processing said input signal based on a feedback gain parameter that compensates for a small-signal gain of a feedback loop that generates said feedback signal.

19. The predistorter of claim 15, further comprising a multiplier for multiplying said input signal by said non-linear gain parameter.

20. The predistorter of claim 19, further comprising a divider for dividing said input signal by said non-linear gain parameter.

21. The predistorter of claim 15, wherein said static coefficients are implemented using a look-up table.

22. The predistorter of claim 15, wherein said static coefficients are implemented using one or more multipliers.

23. An integrated circuit, comprising:
    a predistorter that processes an input signal based on one or more static coefficients representative of a non-linear distortion characteristic of an amplifier and a non-linear gain parameter that reduces an error metric between said input signal and a feedback signal following said amplifier, wherein said nonlinear gain parameter adapts an amount of nonlinearity introduced by said predistorter; and
    an adaptive circuit that adjusts said non-linear gain parameter based on said error metric.

* * * * *

UNITED STATES PATENT AND TRADEMARK OFFICE
CERTIFICATE OF CORRECTION

| | |
|---|---|
| PATENT NO. | : 7,113,036 B2 |
| APPLICATION NO. | : 10/825614 |
| DATED | : September 26, 2006 |
| INVENTOR(S) | : James P. Moffatt |

It is certified that error appears in the above-identified patent and that said Letters Patent is hereby corrected as shown below:

In claim 15, column 12, line 17, "amplifiers" should be replaced by -- amplifier --.

Signed and Sealed this
Twenty-fifth Day of December, 2012

David J. Kappos
*Director of the United States Patent and Trademark Office*